(12) United States Patent
Cooney

(10) Patent No.: US 8,878,636 B2
(45) Date of Patent: Nov. 4, 2014

(54) TECHNIQUES FOR DEVELOPING A NEGATIVE IMPEDANCE

(75) Inventor: Padraig Cooney, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 593 days.

(21) Appl. No.: 13/246,071

(22) Filed: Sep. 27, 2011

(65) Prior Publication Data

US 2013/0038409 A1 Feb. 14, 2013

Related U.S. Application Data

(60) Provisional application No. 61/521,548, filed on Aug. 9, 2011.

(51) Int. Cl.
*H03H 11/52* (2006.01)

(52) U.S. Cl.
CPC ...................................... *H03H 11/52* (2013.01)
USPC .......................................... 333/216; 333/217

(58) Field of Classification Search
CPC .................. H03H 11/48–11/50; H03H 11/52; H03H 11/525

USPC ................................................... 333/213–217
See application file for complete search history.

(56) References Cited

U.S. PATENT DOCUMENTS

| | | | | |
|---|---|---|---|---|
| 4,419,638 | A * | 12/1983 | Johnson | 333/217 |
| 4,904,952 | A * | 2/1990 | Tanimoto | 330/252 |
| 5,825,265 | A * | 10/1998 | Fujii | 333/215 |
| 6,707,354 | B2 * | 3/2004 | Pollet et al. | 333/214 |
| 8,723,625 | B2 * | 5/2014 | Lee | 333/213 |

* cited by examiner

*Primary Examiner* — Dean O Takaoka
*Assistant Examiner* — Alan Wong
(74) *Attorney, Agent, or Firm* — Kenyon & Kenyon LLP

(57) ABSTRACT

Techniques to develop negative impedance circuits that may operate to their power supply rails. The techniques may include generating currents in response to voltage signals presented at respective input terminals of a negative impedance circuit. The voltage signals may be differential signals. The generated currents may be driven through a common impedance within the negative impedance circuit. The currents flowing through the common impedance may be mirrored back to the input terminals of the negative impedance circuit. The negative impedance circuit may be controlled to operate about a common-mode voltage for the circuit.

33 Claims, 6 Drawing Sheets

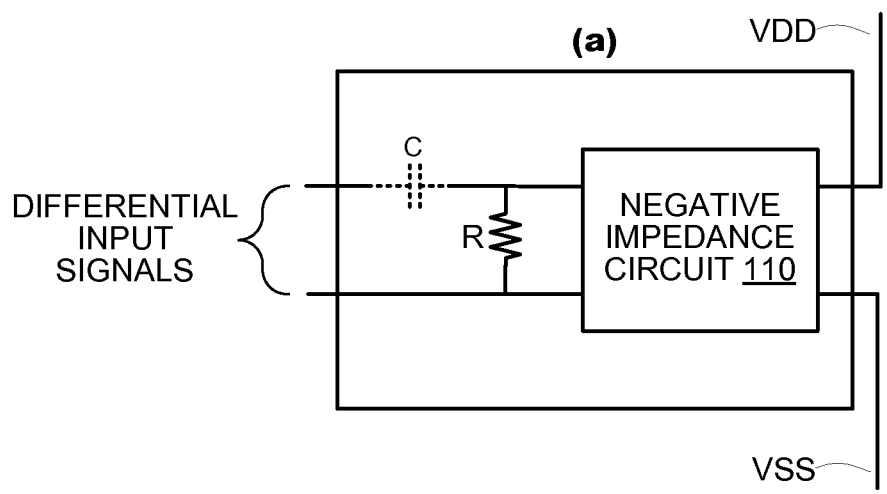
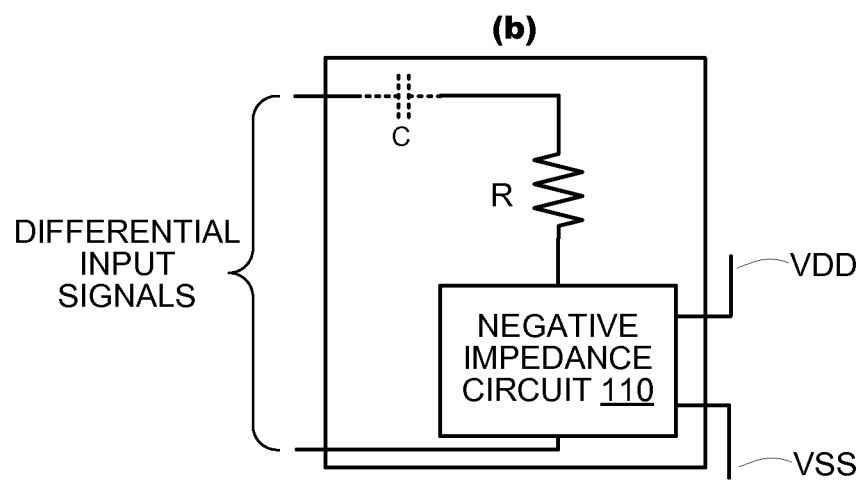
FIG. 1
100

300

400

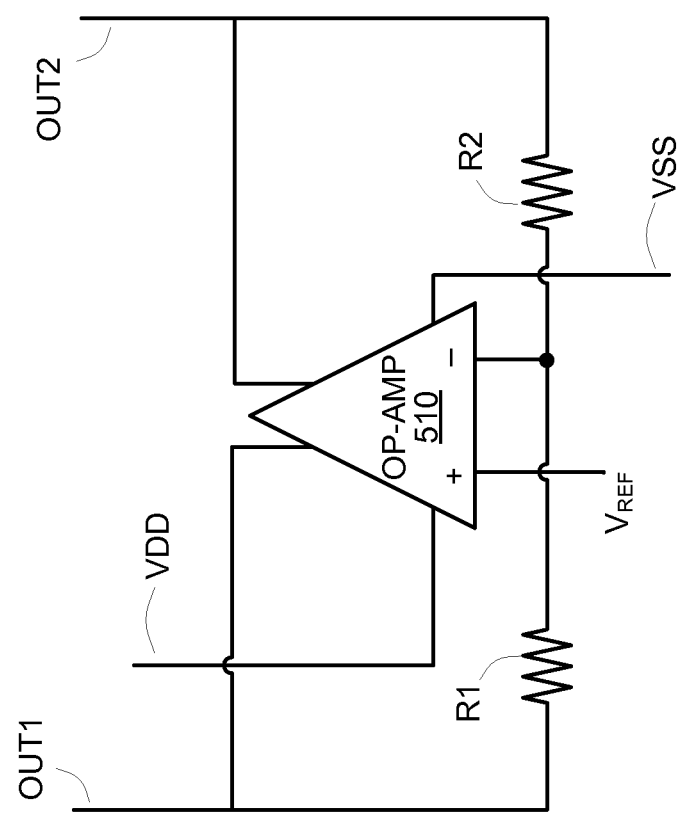

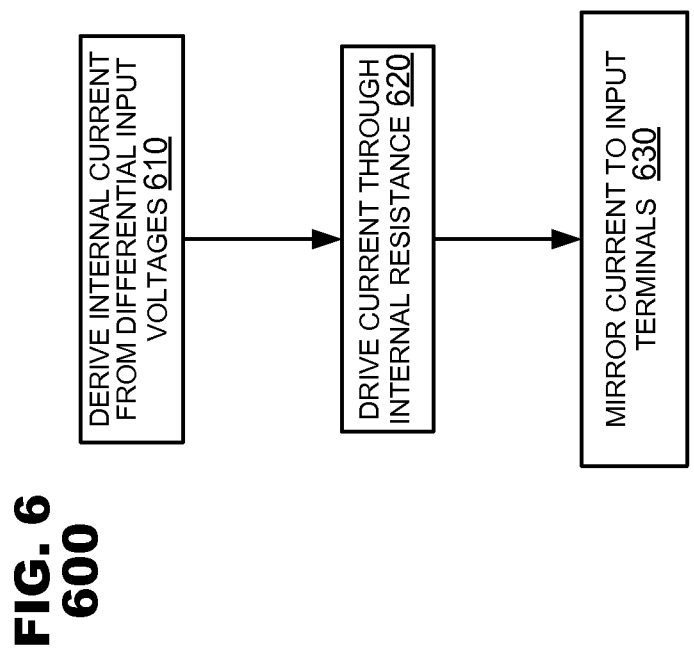

US 8,878,636 B2

TECHNIQUES FOR DEVELOPING A NEGATIVE IMPEDANCE

RELATED APPLICATION

This application claims the benefit of priority afforded by provisional application Ser. No. 61/521,548 filed Aug. 9, 2011.

BACKGROUND

A negative impedance circuit is a device whose current is inversely proportional to the voltage across it. A negative impedance circuit can only be achieved with active circuitry.

Existing techniques for developing a negative impedance typically involve operational amplifier (op-amp) circuits having a "deboo" type structure that direct feedback current to a non-inverting terminal of the op-amp. These negative impedance circuits, however, may have limited operating ranges. This is caused by a requirement that the op-amps have a gain greater than unity in order to develop the negative impedance. Thus, if the voltage at the non-inverting terminal of the op-amp should approach the supply rails for the op-amp, the op-amp will saturate and the negative impedance circuit will become a positive resistance. The op-amp will cease generating a gain and the negative impedance circuit will merely become a positive resistance load.

Accordingly, there is a need in the art to provide techniques to develop a negative impedance circuit that operates to its supply rails.

BRIEF DESCRIPTION OF THE DRAWINGS

FIG. 1 illustrates a negative impedance system according to an embodiment of the present invention.

FIG. 5 illustrates a common-mode controller according to an embodiment of the present invention.

FIG. 6 illustrates a method for developing a negative impedance according to an embodiment of the present invention.

DETAILED DESCRIPTION

Figure 2:
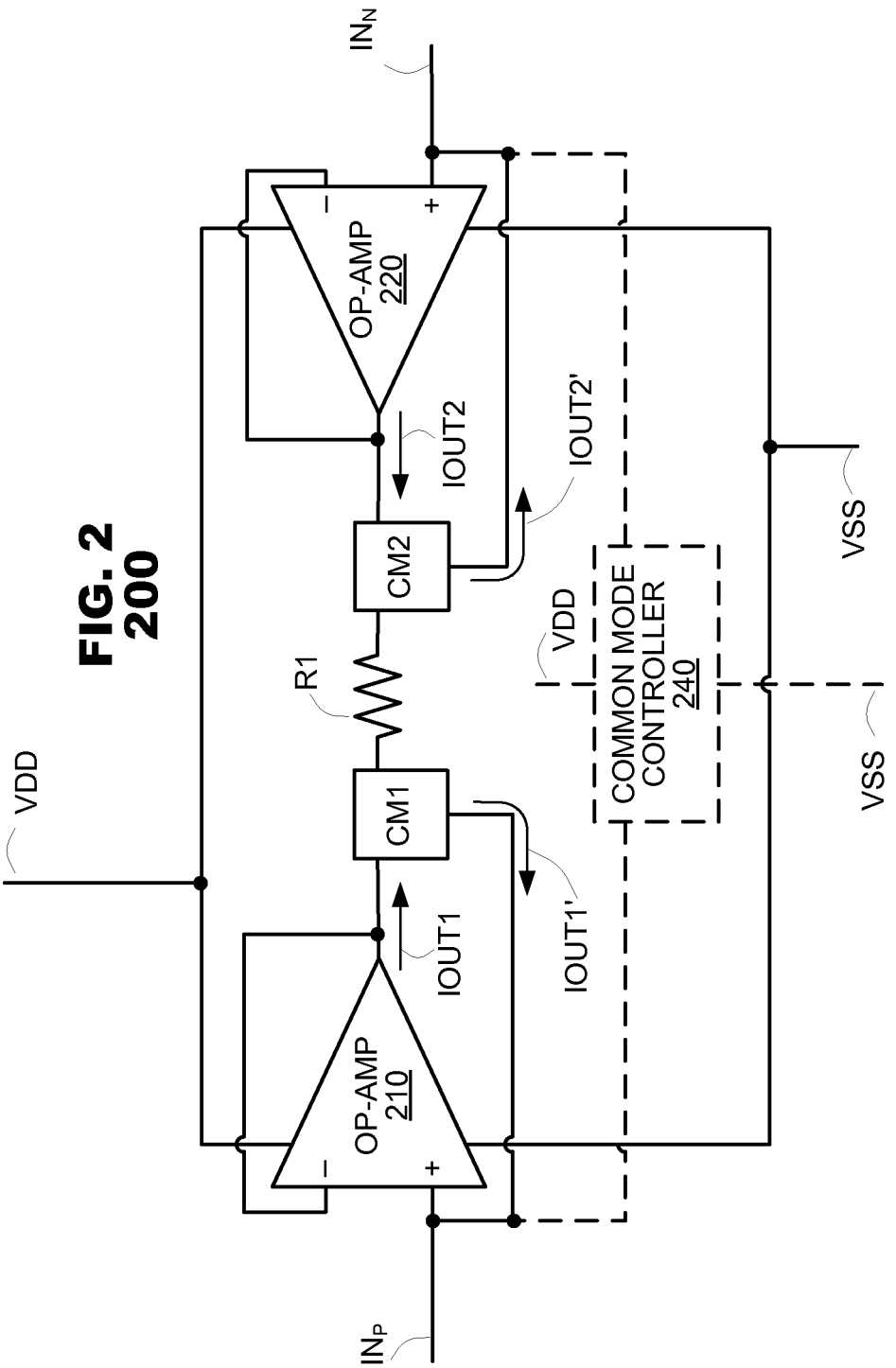
FIG. 2 illustrates a negative impedance circuit according to an embodiment of the present invention.

Embodiments of the present invention provide techniques to develop negative impedance circuits that may operate to their power supply rails. The techniques may include generating currents in response to voltage signals presented at respective input terminals of a negative impedance circuit. The voltage signals may be differential signals. The generated currents may be driven through a common impedance within the negative impedance circuit. The currents flowing through the common impedance may be mirrored back to the input terminals of the negative impedance circuit. The negative impedance circuit may be controlled to operate about a common-mode voltage for the circuit.

FIG. 1 illustrates a negative impedance system 100 according to an embodiment of the present invention. As illustrated in FIG. 1(a), a negative impedance system 100 may include a positive resistance R, and a negative impedance circuit 110 coupled in parallel to the positive resistance R. The system 100 may receive respective positive and negative supply voltages VDD and VSS. The system 100 may further receive differential input signals. The negative impedance circuit 110 may provide a response that acts as if a negative valued impedance had been placed in the system 100. The impedance magnitude for the negative impedance circuit 110 may be tuned for various operating configurations, and, in some applications, may cancel a traditional resistance R provided in the system 100. The combination of the positive resistance R and the negative impedance circuit 110 in FIG. 1(a) may provide an increase in the overall impedance for the system 100.

For a first operating configuration, the magnitude of the impedance for the negative impedance circuit 110 may be tuned to match the magnitude of the resistance for the positive resistance R. The effect of matching the impedance magnitudes may produce an approximately infinite impedance at input nodes of the system 100. The circuit of FIG. 1(a) may be operated in this configuration.

In one example, the positive resistance R may be configured within a resistor-capacitor (RC) circuit. When the capacitor of the RC circuit may be coupled in parallel with the negative impedance circuit 120 having a matched negative impedance, the combined circuits may generate gain for DC signals that may be input to the system 100.

For a second operating configuration, the magnitude of the impedance for the negative impedance circuit 110 may be configured such that it may not be matched to the magnitude of the resistance for the positive resistance R. The effect of the unmatched impedance magnitude for the negative impedance circuit 110 may produce a finite positive impedance for the system 100. Either the circuit of FIG. 1(a) or the circuit of FIG. 1(b) may be operated in this configuration.

In one example, the positive resistance R may be configured within a resistor-capacitor (RC) circuit. When the capacitor of the RC circuit may be coupled in parallel with the negative impedance circuit 110, the unmatched magnitude of the negative impedance circuit 110 may be tuned to generate gain for the combined circuits for predetermined signal frequencies that may be input to the system 100.

FIG. 2 illustrates a negative impedance circuit 200 according to an embodiment of the present invention. As illustrated in FIG. 2, the circuit 200 may include a pair of operational amplifiers 210, 220 ("op-amps") each having its positive input terminal coupled to a respective circuit input terminal $IN_P$, $IN_N$ and its output terminal coupled to its negative terminals. The input signals presented at the input terminals may be differential signals. The circuit 200 may include a pair of current mirrors CM1, CM2 each coupled to an output of a respective op-amp 210, 220 and to a common resistor R1. The current mirrors CM1, CM2 may have a current output coupled to respective input terminals $IN_P$, $IN_N$, and to respective inverting input terminals for each op-amp 210, 220.

The circuit 200 may receive voltages, positive supply rail VDD and negative supply rail VSS, which may provide operating power for each op-amp 210, 220. The gain for each op-amp 210, 220 may be set to less than unity. The resistance for resistor R1 may be set to a value that determines the negative impedance of the circuit 200. The resistance may be tailored to suit individual design needs for the circuit 200.

During operation, respective op-amps 210, 220 may receive differential input signals from respective inputs $IN_P$ and $IN_N$. From these respective differential input signals, each op-amp 210, 220 may generate respective output signals IOUT1, IOUT2 that may drive a current through the resistor 230. As each op-amp 210, 220 generates output signals IOUT1, IOUT2, respective currents IOUT1' and IOUT2' may be mirrored back to the respective inputs $IN_P$ and $IN_N$ from respective current mirrors CM1 and CM2. The currents IOUT1', IOUT2' may have a magnitude that may be proportional to the respective input signals for each op-amp 210, 220. The currents IOUT1' and IOUT2' may propagate out the respective input terminals $IN_P$, $IN_N$, which may emulate a negative impedance at the input terminals $IN_P$ and $IN_N$.

For example, say a differential signal input at circuit input $IN_P$ may an increase in amplitude while a differential signal input at input $IN_N$ may decrease in amplitude. In turn, the voltage output from the op-amp 210 may increase while the voltage output from op-amp 220 may decrease. The current flow through resistor 230 may increase from op-amp 210 toward op-amp 220. The current from op-amp 210 may be mirrored through CM1 back to the input $IN_P$. The current from op-amp 220 may be mirrored through CM2 back to the input $IN_N$ may also decrease. The circuit 200 may operate in a reverse manner if a differential signal input at input $IN_P$ may decrease in amplitude while a differential signal input at input $IN_N$ may increase in amplitude. For the purpose of this example, the current mirrors CM1 and CM2 may be considered ideal mirrors with zero voltage drop across each mirror. In an embodiment, the current mirrored back to the respective inputs may be derived from output stage transistors (not shown) of the respective op-amps 210 and 220 that may carry the load current for each op-amp.

In an embodiment, the circuit 200 may include a common-mode controller 240 that may be coupled to the inverting inputs for each op-amp 210, 220. The common-mode controller 240 may include an internal resistance (not shown) which may be greater than the resistance set for the resistor 230. The internal resistance may be set sufficiently high to ensure that the mirrored currents IOUT1 and IOUT2 may not flow into the controller 240, but rather, flow to the respective inputs $IN_P$ and $IN_N$.

The common-mode controller 240 may control operation of the circuit 200 about a predetermined common-mode voltage. As noted, the input signals presented at the input terminals $IN_P$ and $IN_N$ may be differential signals. The magnitude of the differential input signals may be related to the common-mode voltage and may vary in a differential manner about the common-mode voltage. However, if during operation of the circuit 200, the differential input signals at $IN_P$ and $IN_N$ may diverge from the common-mode voltage in a non-differential manner, the controller 240 may adjust or re-balance operation of the circuit 200 back to the common-mode voltage.

Figure 3:
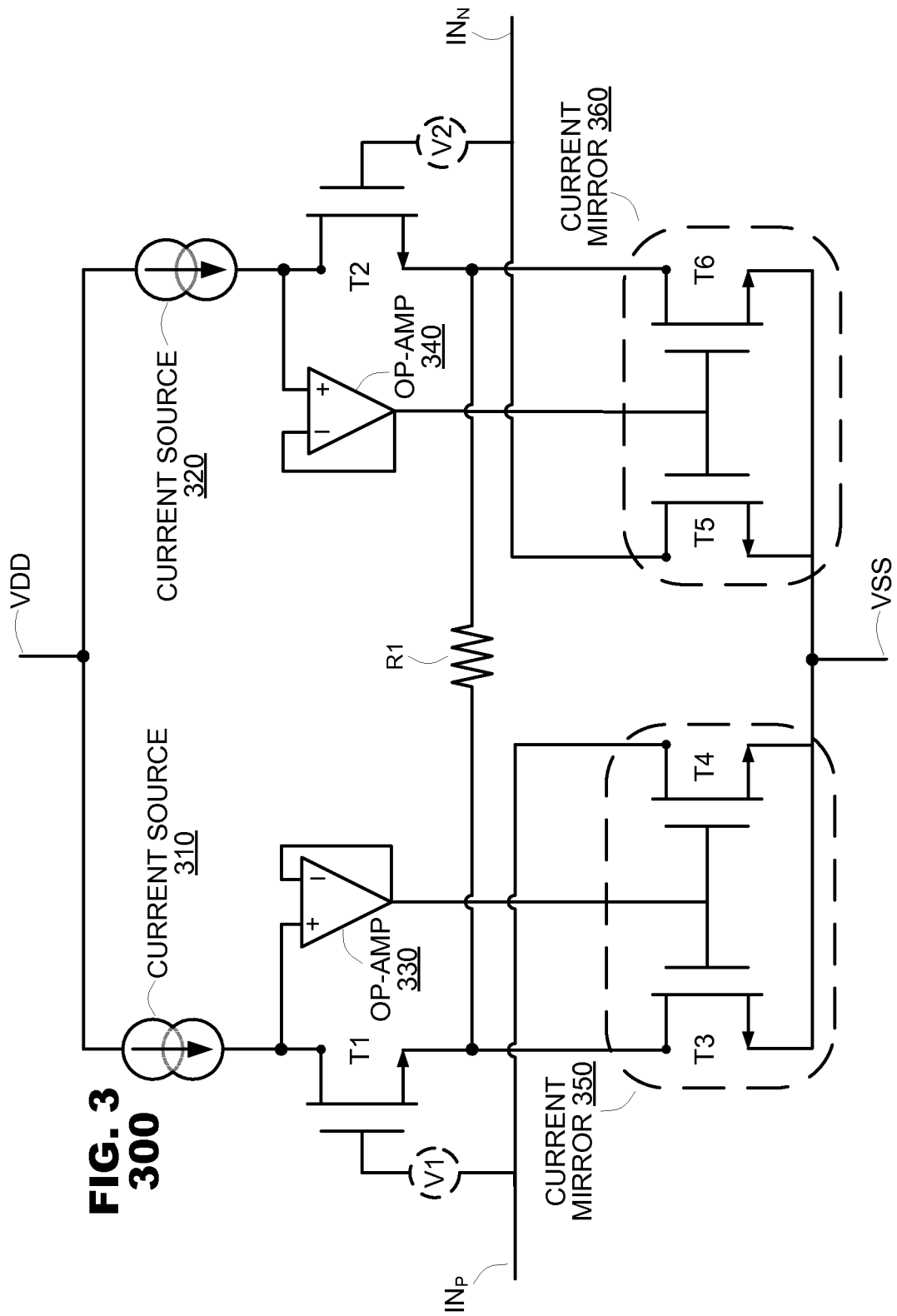
FIG. 3 illustrates a negative impedance circuit according to another embodiment of the present invention.

FIG. 3 illustrates a negative impedance circuit 300 according to another embodiment of the present invention. As illustrated in FIG. 3, the circuit 300 may include a pair of current sources 310, 320; a pair of op-amps 330, 340, a pair of level-shifting transistors T1, T2, and a pair of current mirrors 350, 360. The op-amps each may have output terminal coupled to its negative input terminal.

Each level-shifting transistor T1, T2 may have a gate coupled to an input terminal $IN_P$, $IN_N$ for an input signal. The input signals presented at the input terminals may be differential signals. Each transistor T1, T2 may have a drain coupled to respective current sources 310, 320 and to a positive input terminal of respective op-amps 330, 340. Each transistor T1, T2 may have a source coupled to a common resistor R1 and to a respective current mirror 350, 360. Current mirror 350 may have a mirror transistor T3 having a drain coupled to the source of transistor T1 and to the common resistor R1. Current mirror 350 may have a mirror transistor T4 having a drain coupled to the input terminal INP and to the gate of transistor T1. Current mirror 360 may have a mirror transistor T6 having a drain coupled to the source of transistor T2 and to the common resistor R1. Current mirror 360 may have a mirror transistor T5 having a drain coupled to the input terminal INN and to the gate of transistor T2. The mirror transistors T3 and T4 may be source and gate coupled, wherein the gates may further be coupled to an output from the op-amp 330. The mirror transistors T5 and T6 may be source and gate coupled, wherein the gates may further be coupled to an output from the op-amp 340.

The circuit 300 may receive voltages, positive supply rail VDD and negative supply rail VSS, which may provide power for the current sources 310, 320 and the current mirrors 350, 360. The current sources 310, 320 may each be configured to generate equal predetermined currents. The resistance for resistor R1 may be set to a value such that determines the negative impedance for the circuit 300.

Each level shifting transistor T1, T2 may level shift a respective member of a differential input signal at input terminals $IN_P$ and $IN_N$ and apply this signal across the resistor R1. The current mirrors 350, 360 may operate in a fixed current feedback manner to mirror signal changes present at the circuit 300 inputs $IN_P$ and $IN_N$ back to those respective inputs. The feedback currents for the respective current mirrors 350, 360 may be fixed by the op-amps 330, 340 driving the mirroring transistors for each current mirror—drain connected mirror transistors T3 and T4 for the first current mirror 350, and drain connected mirror transistors T5 and T6 for the second current mirror 360.

For one example, say a differential signal input at circuit input $IN_P$ may increase in voltage while a differential signal input at circuit input $IN_N$ may decrease in voltage. The increase in voltage at $IN_P$ may increase the current across R1 from the level shifting transistor T1 toward the level shifting transistor T2. Less current may flow into mirror transistor T3 thus less current may be sunk through mirror transistor T4. Conversely, more current may flow into mirror transistor T6 thus, more current may be sunk through mirror transistor T5. The effect of raising the voltage and lowering the current of mirror transistor T2 and conversely lowering the voltage and raising the current at mirror transistor T5 may emulate a negative impedance at the input terminals $IN_P$ and $IN_N$.

The operation of the circuit 300 may generate a non-linear response with respect to the differential input signals that may be applied to $IN_P$ and $IN_N$. Transistors T1 and T2 may not become fully conductive until the voltage applied to their respective gates overcomes a threshold voltage for each transistor. Thus, operation of the circuit 300 may be non-linear in response to input signal voltages which may be below the threshold voltage for each transistor. In an embodiment, a pair of voltage sources V1 and V2 may be coupled between respective input terminals and gates for respective level shifting transistors T1, T2 to correct the nonlinearity. The voltage sources V1 and V2 may bootstrap the level shifting transistors T1 and T2 so that their drain-source voltage may remain independent of input signal voltages. However, the operating range for the circuit may be limited by the amount of level shifting required to facilitate bootstrapping transistors T1 and T2.

Figure 4:
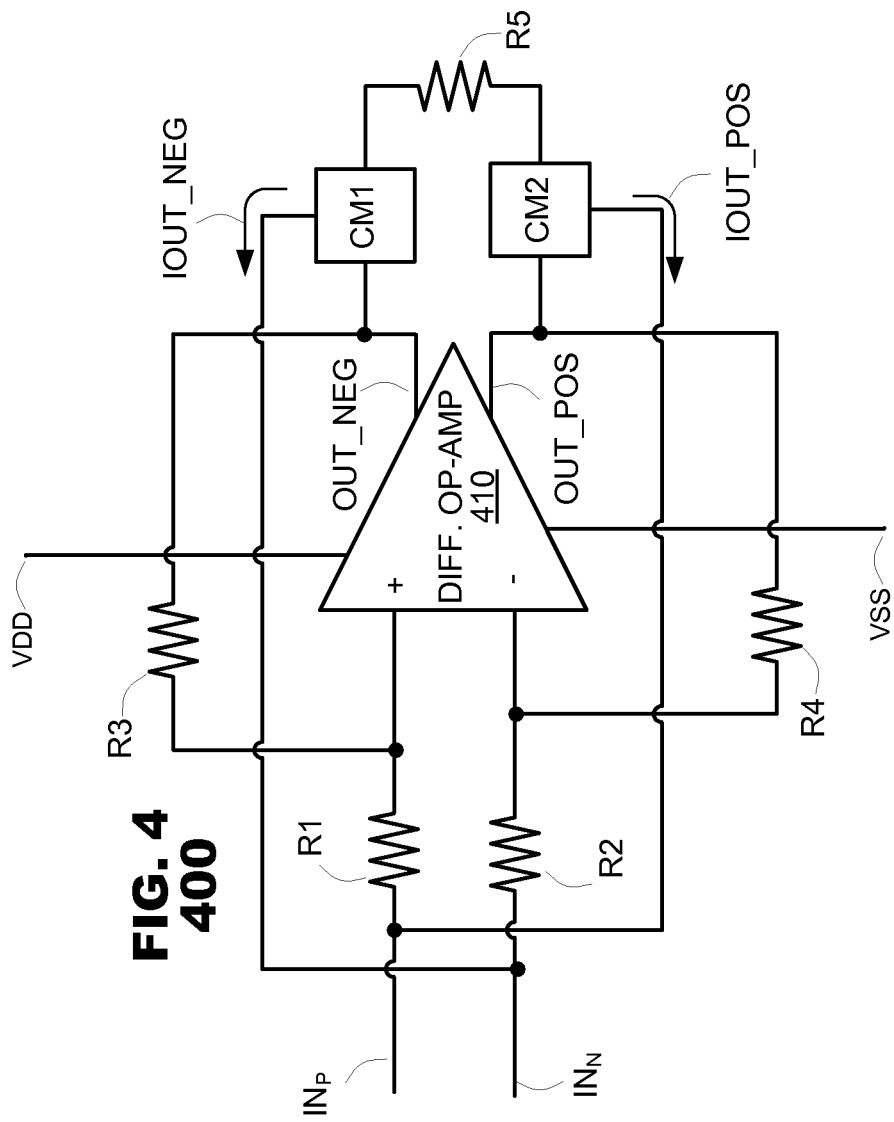
FIG. 4 illustrates a negative impedance circuit according to another embodiment of the present invention.

FIG. 4 illustrates a negative impedance circuit 400 according to another embodiment of the present invention. As illustrated in FIG. 4, the circuit 400 may include a differential op-amp 410 having a positive input terminal coupled to an input terminal $IN_P$ through a first resistor R1, and a negative input terminal coupled to an input $IN_N$ through a second resistor R2. The op-amp 410 may have a negative output terminal OUT_NEG coupled in an inverting manner to the op-amp 410 positive input terminal through a third resistor R3. The op-amp 410 may have a positive output terminal OUT_POS coupled in an inverting manner to the op-amp 410 negative input terminal through a fourth resistor R4. The circuit 400 may include current mirrors CM1 and CM2 coupled respectively to output terminals OUT_NEG and OUT_POS and to opposite terminals of a common resistor R5. The circuit 400 may receive voltages, positive supply rail VDD and negative supply VSS, which may provide operating power to the differential op-amp 410.

The input terminals $IN_P$ and $IN_N$ may have a predetermined common-mode potential. Common-mode control for the op-amp 410 outputs OUT_POS and OUT_NEG may be set by a common-mode controller (not shown) internal to the op-amp 410. The resistance for resistor R5 may be set to a value that determines the negative impedance of the circuit 400. The resistance may be tailored to suit individual design needs for the circuit 400. The resistances for resistors R1-R4 may be set such that they be greater in magnitude than resistor R5 and may be balanced for each respective op-amp output (e.g., R1 and R2 may have equal resistances; R3 and R4 may have equal resistances).

During operation, the circuit 400 may be configured to generate an inverting voltage gain from op-amp 410 across resistor R5. Differential input signals that may be input to the circuit 400 at input terminals $IN_P$ and $IN_N$ may be replicated across the resistor R5. The op-amp 410 may generate differential output voltages that may drive a current through the resistor R5. As the op-amp 410 may generate the output signals, respective currents IOUT_POS and IOUT_NEG may be mirrored back to the respective inputs $IN_P$ and $IN_N$ from respective current mirrors CM1 and CM2. The currents IOUT_POS and IOUT_NEG may propagate out the respective input terminals $IN_P$, $IN_N$, which may emulate a negative impedance at the input terminals $IN_P$ and $IN_N$.

For example, say a differential signal input at the input terminal $IN_P$ may increase in amplitude while a differential signal input at the input terminal $IN_N$ may decrease in amplitude. In turn, the voltage output from the terminal OUT_POS may increase while the voltage output from the terminal OUT_NEG may decrease. The current flow through the resistor R5 may increase from the OUT_POS terminal toward the OUT_NEG terminal. The current IOUT_POS flowing from the output terminal OUT_POS may be mirrored through CM1 back to the input terminal $IN_P$. The current IOUT_NEG flowing from the output terminal OUT_NEG may be mirrored through CM2 back the input terminal $IN_N$. The circuit 400 may operate in a reverse manner if a signal input at input $IN_P$ may decrease in amplitude while a signal input at input $IN_N$ may increase in amplitude.

FIG. 5 illustrates a common-mode controller 500 according to an embodiment of the present invention. As illustrated in FIG. 5, the common-mode controller 500 may include an op-amp 510 having a pair of outputs OUT1 and OUT 2 coupled to a respective a first and second resistor R1 and R2. Each resistor R1 and R2 may further be coupled to an inverting input terminal for the op-amp 510. The op-amp 510 may further receive a reference voltage $V_{REF}$ coupled to a non-inverting input terminal for the op-amp. The controller 500 may receive voltages, positive supply rail VDD and negative supply rail VSS, which may provide operating rails to the op-amp 510. The output terminals OUT1 and OUT2 may further be coupled to respective input terminals for a negative impedance circuit (i.e., input terminals $IN_P$ and $IN_N$ of FIG. 2). The resistances for the first and second resistors R1 and R2 may be equal to each other. Clearly, the resistances for resistors R1 and R2 may be set sufficiently high to ensure that the resistors R1 and R2 do not excessively load the negative impedance circuit.

During operation, the average voltage between OUT1 and OUT2 (as driven across R1 and R2) may be input to the inverting terminal of the op-amp 510. The op-amp 510 may compare the average voltage to the reference voltage $V_{REF}$ and steer its respective output currents toward the reference voltage $V_{REF}$. Thus, the controller 500 may dynamically control a negative impedance circuit to manage voltage drift for the circuit with respect to the reference voltage $V_{REF}$.

FIG. 6 illustrates a method 600 for developing a negative impedance according to an embodiment of the present invention. As illustrated in FIG. 6, the method 600 may derive an internal current from differential input voltages (block 610). The method 600 may drive the current through an internal resistance (block 620). The method 600 may mirror the current to input terminals to emulate the effect of a negative impedance (block 630).

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

I claim:

1. A circuit system, comprising:
   a first resistance;
   a negative impedance circuit operatively connected to the first resistance and having current generators each generating currents in response to a voltage presented at respective input terminals of the negative impedance circuit;
   a second resistance coupled to both current generators; and
   a pair of current mirrors each to mirror currents from a respective current generator to one of the input terminals.

2. The circuit system of claim 1, wherein the value of the first resistance is equal to the value of the second resistance.

3. The circuit system of claim 1, wherein the value of the first resistance is less than the value of the second resistance.

4. The circuit system of claim 1, wherein the first resistance is operatively connected in parallel with the negative impedance circuit.

5. The circuit system of claim 1, wherein the first resistance is operatively connected in series with the negative impedance circuit.

6. The circuit system of claim 1, wherein the current generators are a pair of op-amps.

7. The circuit system of claim 6, wherein the current mirrors are integrated into respective output stages for each op-amp.

8. The circuit system of claim 1, wherein the current generators are a differential op-amp.

9. The circuit system of claim 8, wherein the current mirrors are integrated into respective output stages for the differential op-amp.

10. A circuit system, comprising:
a first resistance;
a negative impedance operatively connected to the first resistance and having current generators each generating a predetermined current;
a pair of level shifting transistors each receiving a current from a respective current generator and driving the current through a second resistance; and
a pair of current mirrors each to mirror currents from a respective level shifting transistor to respective input terminals of the negative impedance circuit.

11. The circuit system of claim 10, wherein the value of the first resistance is equal to the value of the second resistance.

12. The circuit system of claim 10, wherein the value of the first resistance is less than the value of the second resistance.

13. The circuit system of claim 10, wherein the first resistance is operatively connected in parallel with the negative impedance circuit.

14. The circuit system of claim 10, wherein the first resistance is operatively connected in series with the negative impedance circuit.

15. A negative impedance circuit, comprising:
a pair of op-amps for generating a current through a common impedance in response to each receiving one of a pair of differential input voltages; and
a pair of current mirrors for mirroring the current from each op-amp to input terminals at which the differential input voltages are received.

16. The circuit of claim 15, wherein the value of the common impedance determines a negative impedance value for the circuit.

17. The circuit of claim 15, wherein each of the op-amps are configured in a positive feedback manner.

18. The circuit of claim 15, further comprising:
a common-mode voltage controller having a pair of differential outputs coupled to the respective input terminals.

19. The circuit of claim 15, wherein the pair of current mirrors are integrated into respective output stages for each op-amp.

20. A negative impedance circuit, comprising:
a differential op-amp for generating a current through a common impedance in response to receiving a pair of differential input voltages; and
a pair of current mirrors for mirroring the current from each of the respective outputs to input terminals at which the differential input voltages are received.

21. The circuit of claim 20, wherein the value of the common impedance determines a negative impedance value for the circuit.

22. The circuit of claim 20, wherein the pair of current mirrors are integrated into respective output stages for the differential op-amp.

23. A negative impedance circuit, comprising:
a pair of current sources;
a pair of level shifting transistors each connected at its drain to a respective current source, connected at its gate to one of a pair of differential input terminals, and connected at its source to a common impedance;
a pair of op-amps each connected at an input to a respective level shifting transistor drain and having an output connected to another of its inputs; and
a pair of current mirrors each having a current input connected to a respective level shifting transistor source, a current output connected to one of the pair of differential input terminals, and a current control coupled to an output of a respective op-amp.

24. The circuit of claim 23, wherein the value of the common impedance determines a negative impedance value for the circuit.

25. The circuit of claim 23, further comprising:
a respective bootstrapping voltage coupled to each of the respective level shifting transistor gates.

26. A method for developing a negative impedance, comprising:
generating currents in response to each of a pair of differential input voltages;
passing the currents through a common impedance; and
mirroring the currents to input terminals at which the differential voltages are received.

27. The method of claim 26, the generating further comprising:
generating the currents from a pair of op-amps having outputs coupled to the common impedance.

28. The method of claim 27, wherein the currents are mirrored from a respective output stage of each of the pair of op-amps.

29. The method of claim 27, the generating further comprising:
balancing, in an active manner, the differential input voltages to a predetermined common-mode voltage.

30. The method of claim 29, wherein the balancing is managed by a common-mode voltage controller.

31. The method of claim 26, the generating further comprising:
generating the currents from a pair of transistors each having a gate coupled to one of the differential input voltages and a source coupled in an opposing configuration to the common impedance.

32. The method of claim 31, wherein the currents are mirrored from a respective transistor current mirror of each source follow transistor.

33. The method of claim 26, the generating further comprising:
generating the currents from a differential op-amp having differential outputs coupled in an opposing configuration to the common impedance.

* * * * *